(12) United States Patent
Kim

(10) Patent No.: US 9,523,876 B2
(45) Date of Patent: Dec. 20, 2016

(54) DISPLAY DEVICE WITH ANTISTATIC LAYER

(71) Applicant: SAMSUNG DISPLAY CO., LTD., Yongin, Gyeonggi-Do (KR)

(72) Inventor: Hwa-Jeong Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 14/252,643

(22) Filed: Apr. 14, 2014

(65) Prior Publication Data

US 2015/0077952 A1   Mar. 19, 2015

(30) Foreign Application Priority Data

Sep. 16, 2013   (KR) .................. 10-2013-0111087

(51) Int. Cl.
| | |
|---|---|
| *H05B 33/14* | (2006.01) |
| *H05K 9/00* | (2006.01) |
| *G02F 1/1333* | (2006.01) |
| *G02F 1/167* | (2006.01) |
| *H01L 51/00* | (2006.01) |
| *H01L 51/52* | (2006.01) |
| *H01L 27/32* | (2006.01) |

(52) U.S. Cl.
CPC ......... *G02F 1/133305* (2013.01); *G02F 1/167* (2013.01); *H01L 27/3244* (2013.01); *H01L 51/003* (2013.01); *H01L 51/0097* (2013.01); *H01L 51/5253* (2013.01); *G02F 2202/22* (2013.01); *H01L 51/5256* (2013.01); *H01L 2251/5338* (2013.01); *Y02E 10/549* (2013.01); *Y02P 70/521* (2015.11)

(58) Field of Classification Search
CPC ....................................................... H01J 29/868
See application file for complete search history.

(56) References Cited

U.S. PATENT DOCUMENTS

| | | | | |
|---|---|---|---|---|
| 5,742,118 | A * | 4/1998 | Endo .................... | C03C 17/007 106/286.4 |
| 7,087,351 | B2 * | 8/2006 | Aylward ............... | G02F 1/1333 313/504 |
| 2007/0224430 | A1 * | 9/2007 | Iwanaga ............. | C23C 14/0676 428/446 |
| 2010/0096970 | A1 * | 4/2010 | Itoh .......................... | H01J 1/70 313/313 |
| 2014/0028969 | A1 | 1/2014 | Pugh et al. | |
| 2014/0061610 | A1 | 3/2014 | Mun et al. | |

FOREIGN PATENT DOCUMENTS

| | | |
|---|---|---|
| JP | 4741200 B2 | 8/2011 |
| KR | 10-0766575 B1 | 10/2007 |
| KR | 10-2007-0121974 | 12/2007 |
| KR | 10-2008-0046990 | 5/2008 |
| KR | 10-2014-0028969 | 3/2014 |
| KR | 10-2014-0029135 | 3/2014 |

* cited by examiner

*Primary Examiner* — Joseph L Williams
(74) *Attorney, Agent, or Firm* — Lewis Roca Rothgerber Christie LLP

(57) ABSTRACT

A display device and a manufacturing method thereof. The display device includes a substrate including at least one plastic layer; and a display layer on the substrate and including a plurality of signal lines and a plurality of pixels. The substrate includes at least one antistatic layer.

6 Claims, 8 Drawing Sheets

DISPLAY DEVICE WITH ANTISTATIC LAYER

CROSS-REFERENCE TO RELATED APPLICATION

This application claims priority to and the benefit of Korean Patent Application No. 10-2013-0111087, filed in the Korean Intellectual Property Office on Sep. 16, 2013, the entire contents of which are incorporated herein by reference.

BACKGROUND

1. Field

Aspects of embodiments of the present invention are directed toward to a display device, particularly to a flexible display device and a method of manufacturing the same.

2. Description of the Related Art

Flexible display devices are display devices that are foldable or bendable like paper, not limited to a rectangular outline, not broken when flexed or bent due to a flexible substrate, and able to be easily carried. The flexible display devices may be categorized as a rugged display device that can resist breakage due to an impact, a bendable display device that is flexible and partially foldable in design, or a rollable display device that can freely roll like a roll of paper.

In order to develop a flexible display device, a flexible substrate, an organic/inorganic material suitable for a low-temperature process, a flexible electronic device, a suitable passivation layer, a suitable blocking film, and suitable packaging are needed in combination. Of these factors, the flexible substrate is recognized as an important component that determines the performance, reliability, and price of the flexible display device.

A metal foil substrate, a thin glass substrate, a plastic substrate, and the like have been studied as potential flexible substrates. Of these substrates, the plastic substrate has been noted as the most suitable material due to its ease of machining, light weight, and suitability for multiple processes. When utilizing the plastic substrate, however, static electricity is easily generated by separation, friction, etc., and the static electricity may cause poor image quality and breakdown of components.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward a display device capable of preventing or removing static electricity, and a method of manufacturing the display device.

According to an example embodiment of the present invention, a display device includes a substrate including at least one plastic layer; and a display layer on the substrate and including a plurality of signal lines and a plurality of pixels, and the substrate includes at least one antistatic layer.

The substrate may include a first plastic layer, a first barrier layer, a second plastic layer, and a second barrier layer.

The antistatic layer may be between the first barrier layer and the second plastic layer.

The antistatic layer may include a transparent conductive oxide.

The display device may further include a buffer layer between the substrate and the display layer.

The antistatic layer may include the plastic layer including conductive balls, and the conductive balls may be conductive particulates.

Each of the conductive balls may include a metal, metal oxide, metal alloy, and/or carbon fiber.

Each of the conductive balls may include a core and a shell. The core may include a polymer, glass, or ceramic, and the shell may be coated with a metal.

According to another example embodiment of the present invention, a method of manufacturing a display device includes forming a substrate on a support member, the substrate includes at least one plastic layer; forming a display layer including a plurality of signal lines and a plurality of pixels on the substrate; and separating the substrate from the support member, and the forming of the substrate includes forming at least one antistatic layer.

The forming of the substrate may include forming a barrier layer after forming the plastic layer.

The substrate may include a first plastic layer, a first barrier layer, a second plastic layer, and a second barrier layer, and the antistatic layer may be between the first barrier layer and the second plastic layer.

The antistatic layer may include a transparent conductive oxide.

The method may further include forming a buffer layer before the forming of the display layer.

The antistatic layer may include the plastic layer including conductive balls.

The plastic layer, including the conductive balls, may be formed by combining conductive balls with plastic, coating the mixture on a surface, and then hardening the mixture.

Each of the conductive balls may include a metal, metal oxide, metal alloy, and/or carbon fiber.

According to yet another example embodiment of the present invention, a method of manufacturing a display device includes forming an antistatic layer on a support member; forming a substrate on the antistatic layer, the substrate includes a plastic layer; forming a display layer including a plurality of signal lines and a plurality of pixels on the substrate; and separating the substrate from the support member.

The antistatic layer may include a transparent conductive oxide, a conductive organic material, or a conductive metal.

According to still another example embodiment of the present invention, a method of manufacturing a display device includes forming a substrate on an antistatic support member, the substrate includes at least one plastic layer; forming a display layer including a plurality of signal lines and a plurality of pixels on the substrate; and separating the substrate from the support member.

The antistatic support member may include a conductive glass plate.

According to aspects of embodiments of the present invention, it is possible to remove static electricity that may be generated when manufacturing a display panel, for example, when separating a support member and a display panel and when changing processes, and to prevent static electricity. Further, it is possible to block or reduce the influence of static electricity that may be generated after manufacturing a display panel. Therefore, it is possible to prevent breakdown of or increase a lifespan of elements of a display device and to prevent poor image quality.

DETAILED DESCRIPTION

Figure 1:
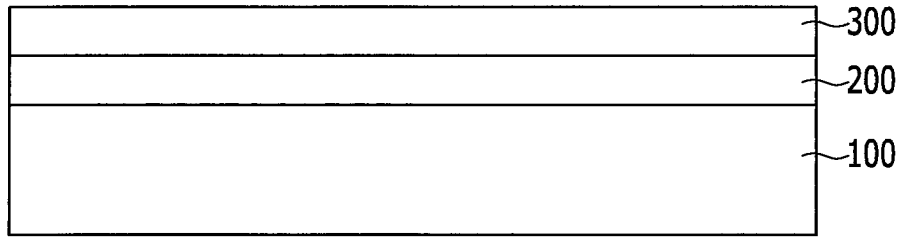
FIG. 1 is a cross-sectional view of a display device according to an example embodiment of the present invention.

Hereinafter, example embodiments of the present invention will be described in detail with reference to the accompanying drawings so that those skilled in the art may easily practice the present invention. As those skilled in the art would realize, the described embodiments may be modified in various different ways, all without departing from the spirit or scope of the present invention.

In the drawings, the thickness of layers, films, panels, regions, etc. may be exaggerated for clarity of various layers and regions. Like reference numerals designate like elements throughout the specification. It will be understood that when an element such as a layer, film, region, or substrate is referred to as being "on" another element, it can be directly on the other element or intervening elements may be present. In contrast, when an element is referred to as being "directly on" another element, there are no intervening elements present. Expressions such as "at least one of," when preceding a list of elements, modify the entire list of elements and do not modify the individual elements of the list. Further, the use of "may" when describing embodiments of the present invention refers to "one or more embodiments of the present invention."

A display device according to an example embodiment of the present invention and a method of manufacturing the display device will be described with reference to the drawings.

Figure 2:
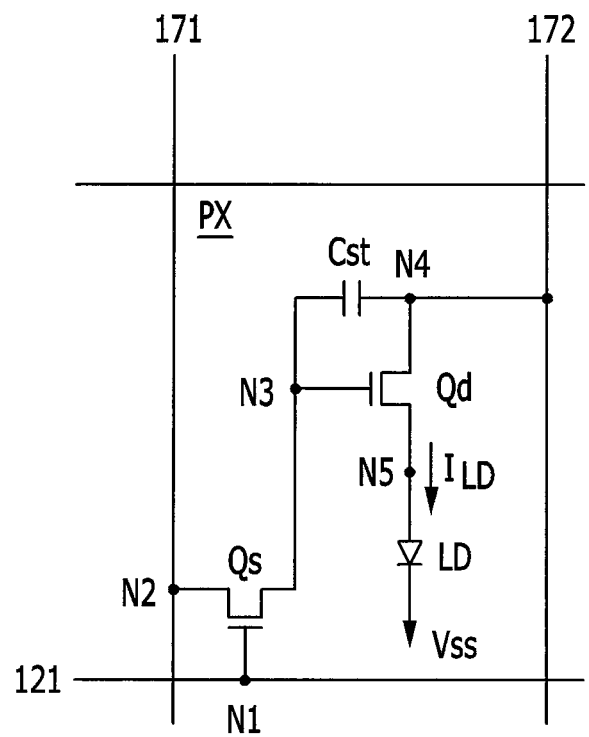
FIG. 2 is a circuit diagram of one pixel of an organic light emitting device according to an example embodiment of the present invention.

FIG. 1 is a cross-sectional view of a display device according to an example embodiment of the present invention, and FIG. 2 is a circuit diagram of one pixel of an organic light emitting device according to an example embodiment of the present invention. Although an organic light emitting diode display is mainly described in the following description, the present invention is available for other display devices, such as a liquid crystal display or an electrophoretic display.

As illustrated in FIGS. 1 and 2, a display device according to the example embodiment of the present invention includes a display panel displaying an image (e.g., configured to display an image) including a substrate 100, a display layer 200, and an encapsulation layer 300. The display device also includes a driving unit for driving the display panel and a control unit that controls the operation of the driving unit.

The substrate 100 may be made of a transparent insulating material. The substrate 100 may be a flexible substrate, such as a polymer film. The substrate 100 may be made of plastic, for example, a thermoplastic semi-crystalline polymer such as polyethylene terephthalate (PET), polyethylene naphthalate (PEN), polyether ether ketone (PEEK), a thermoplastic amorphous polymer such as polycarbonate (PC) or polyethylene sulfonate (PES), a polyimide (PI) having relatively high thermal resistance, or polyarylate (PAR).

The substrate 100 may be formed by extrusion or solvent casting, depending on the characteristics of plastic. Extrusion may be a method of forming a substrate by melting plastic and then extending the plastic along two directions. The solvent casting may be a method of forming a substrate by mixing and dissolving plastic and an additive into a solvent to ensure fluidity and then volatilizing the solvent while passing the mixture through a slit die having a substantially constant thickness. The substrate 100 may also be formed by applying or coating a plastic solution onto a flat plate and then hardening the solution.

Unlike glass substrates, water and/or oxygen may easily infiltrate plastic substrates and deteriorate image quality of a display device. Therefore, the plastic substrates may be designed or formed in a structure to prevent water and oxygen from infiltrating therethrough. For example, the substrate 100 may be formed as a stacked structure with a barrier layer including an inorganic monolayer or multilayer or an organic/inorganic hybrid multilayer on a plastic layer. An overcoat layer (e.g., a transparent polymer layer) may be formed on the barrier layer to protect the barrier layer. The substrate 100 may have a stacked structure including several, for example, two to five combinations of a plastic layer and a barrier layer which are repeatedly stacked (e.g., alternatively stacked). The kinds and thicknesses of the layers of the stacked substrate 100 are selected to enhance or optimize the optical and thermal properties of the substrate 100.

In order to form an organic layer as the barrier layer, flash evaporation that coats and hardens an organic material in a vacuum state may be used. An inorganic layer as the barrier layer may be formed by depositing silicon oxide (e.g., $SiO_x$) or silicon nitride (e.g., $SiN_x$) using PECVD (plasma enhanced chemical vapor deposition), APCVD (atmospheric pressure CVD), or LPCVD (low pressure CVD).

The substrate 100 may include an antistatic layer that removes static electricity (e.g., that is configured to remove or prevent the buildup of static electricity). The plastic layer in the substrate 100 may be the antistatic layer or an antistatic layer may be formed independent from the plastic layer.

The display layer 200 includes a plurality of signal lines 121, 171, and 172 and a plurality of pixels PX coupled to (e.g., connected to) the plurality of signal lines, as illustrated in FIG. 2. The pixel PX may be, for example, a red pixel R, a green pixel G, or a blue pixel B. The plurality of signal lines include a scanning signal line 121 transmitting gate signals (or scanning signals) (e.g., configured to transmit gate or scanning signals), a data line 171 transmitting data signals (e.g., configured to transmit data signals), and a driving voltage line 172 transmitting driving voltages (e.g., configured to transmit driving voltages). The scanning signal lines 121 extend substantially along a row direction (or a first direction) substantially in parallel with each other, and the data lines 171 extend substantially along a column direction (or a second direction crossing the first direction) substantially in parallel with each other. Although the driving voltage lines 171 are shown to extend substantially along the column direction, the driving voltage lines 171 may extend along the row direction or the column direction or may be formed as a matrix with crossing voltage lines.

Each pixel PX includes a thin film transistor including a switching transistor Qs, a driving transistor Qd, a storage capacitor Cst, and a light-emitting device LD. Each pixel PX may further include a thin film transistor and a capacitor to compensate for or to stabilize the current supplied to the light-emitting device.

The switching transistor Qs includes a control terminal N1, an input terminal N2, and an output terminal N3. The control terminal N1 is coupled to (e.g., connected to) the scanning signal line 121, the input terminal N2 is coupled to (e.g., connected to) the data line 171, the output terminal N3 is coupled to (e.g., connected to) the driving transistor Qd. The switching transistor Qs transmits a data signal received from the data line 171 to the driving transistor Qd in response to a scanning signal received from the scanning signal line 121.

The driving transistor Qd also includes a control terminal N3, an input terminal N4, and an output terminal N5. The control terminal N3 is coupled to (e.g., connected to) the switching transistor Qs, the input terminal N4 is coupled to (e.g., connected to) the driving voltage line 172, and the output terminal N5 is coupled to (e.g., connected to) the light-emitting device LD. The driving transistor Qd sends out (or outputs) an output current $I_{LD}$ of which the magnitude depends on the voltage difference between the control terminal N3 and the output terminal N5.

The capacitor Cst is coupled (e.g., connected) between the control terminal N3 and the input terminal N4 of the driving transistor Qd. The capacitor Cst receives a data signal supplied to the control terminal N3 of the driving transistor Qd and keeps (or stores) the data signal even after the switching transistor Qs is turned off.

The light-emitting device LD, for example, an organic light emitting diode (OLED), includes an anode coupled to (e.g., connected to) the output terminal N5 of the driving transistor Qd and a cathode coupled to (e.g., connected to) a common voltage Vss. The light-emitting device LD emits light having varying intensities depending on the output current $I_{LD}$ of the driving transistor Qd, and a plurality of light-emitting devices display an image in combination with each other. The light-emitting device LD may include a material that specifically emanates light of any one of the primary colors, that is, red, green, and blue, and the display device displays a desired image by spatially combining the colors.

The switching transistor Qs and the driving transistor Qd may be p-channel electric field effect transistors (FET), but at least one of them may be an n-channel electric field effect transistor (FET). Further, the connection relationships of the transistors Qs and Qd, the capacitor Cst, and the light-emitting device LD may be changed.

The encapsulation layer 300 is disposed opposite to (e.g., faces) the substrate 100 with the display layer 200 therebetween and may protect the light-emitting device by preventing oxygen and water from flowing into the display layer 200 from the outside. The encapsulation layer 300 may be formed by stacking (e.g., alternately stacking) one or more organic layers and one or more inorganic layers.

The organic layer may be composed of macromolecules and may be a monolayer or a multilayer made of any one of polyethylene terephthalate (PET), a polyimide (PI), polycarbonate (PC), an epoxy, polyethylene (PE), or polyacrylate (PA). The polyacrylate (PA) may include a material produced by polymerizing a monomer component including a diacrylate-based monomer and a triacrylate-based monomer. A monoacrylate-based monomer may be further included in the monomer component. Further, a photoinitiator, such as thermoplastic polyolefin (TPO), may be further included in the monomer component, but the present invention is not limited thereto.

The inorganic layer may be a monolayer or a multilayer including a metal oxide or a metal nitride. For example, the inorganic layer may include any one of silicon nitride (e.g., $SiN_x$), aluminum oxide (e.g., $Al_2O_3$), silicon oxide (e.g., $SiO_2$), or titanium oxide (e.g., $TiO_2$). A top layer of the encapsulation layer 300, which is exposed to the outside, may be an inorganic layer to prevent moisture from infiltrating into the light-emitting device.

Further, the encapsulation layer 300 may include at least one sandwich structure (e.g., a stacked structure) with at least one organic layer between at least two inorganic layers. Further, the encapsulation layer 300 may include at least one sandwich structure with at least one inorganic layer between at least two organic layers.

Further, the encapsulation layer 300 may include a first inorganic layer, a first organic layer, and a second inorganic layer sequentially from a top of the light-emitting device. Further, the thin film encapsulation layer 300 may include a first inorganic layer, a first organic layer, a second inorganic layer, a second organic layer, and a third inorganic layer sequentially from the top of the light-emitting device. Further, the thin film encapsulation layer 300 may include a first inorganic layer, a first organic layer, a second inorganic layer, a second organic layer, a third inorganic layer, a third organic layer, and a fourth inorganic layer sequentially from the top of the organic emitting element.

A metal halide layer containing lithium fluoride (LiF) may be further included between the light-emitting device and the first inorganic layer and may prevent damage to the light-emitting device when the first inorganic layer is formed by sputtering or plasma deposition.

The first organic layer may be smaller in area (e.g., may have a smaller surface area) than that of the second inorganic layer, and the second organic layer may also be smaller in area (e.g., may have a smaller surface area) than that of the third inorganic layer. Further, the first organic layer may be fully covered (e.g., encapsulated) by the second inorganic layer, and the second organic layer may also be fully covered (e.g., encapsulated) by the third inorganic layer.

The encapsulation layer 300 (e.g., a thin film) is easily damaged by a scratch from the outside or an impact (e.g., a hack) or a scratch due to foreign substances produced during manufacturing. The damage appears as a defect such as a dark point or spot. A protective film may be attached to the encapsulation layer 300 to prevent damage to the encapsulation layer 300.

Some examples that may be implemented in connection with an antistatic layer of a substrate in the display device according to embodiments of the present invention will be described hereinafter.

Figure 3:
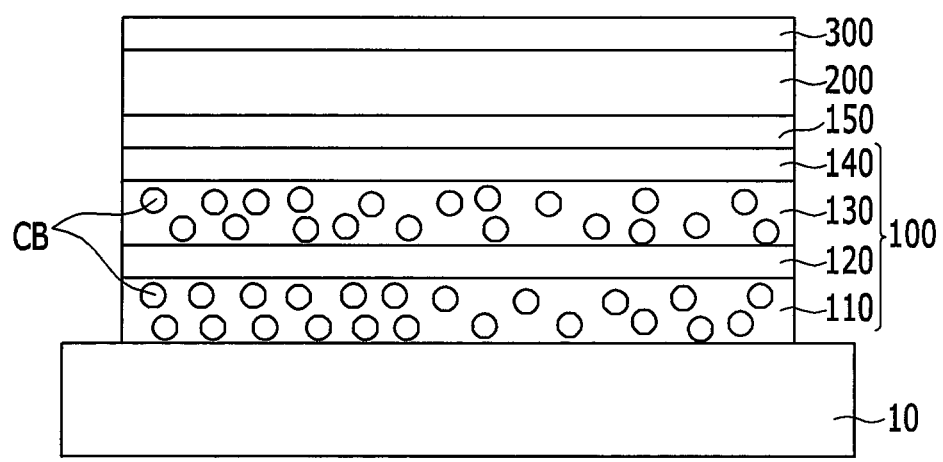
FIGS. 3 and 4 are cross-sectional views before and after a support member is removed during the process of manufacturing a display device according to a first embodiment of the present invention.
Figure 4:
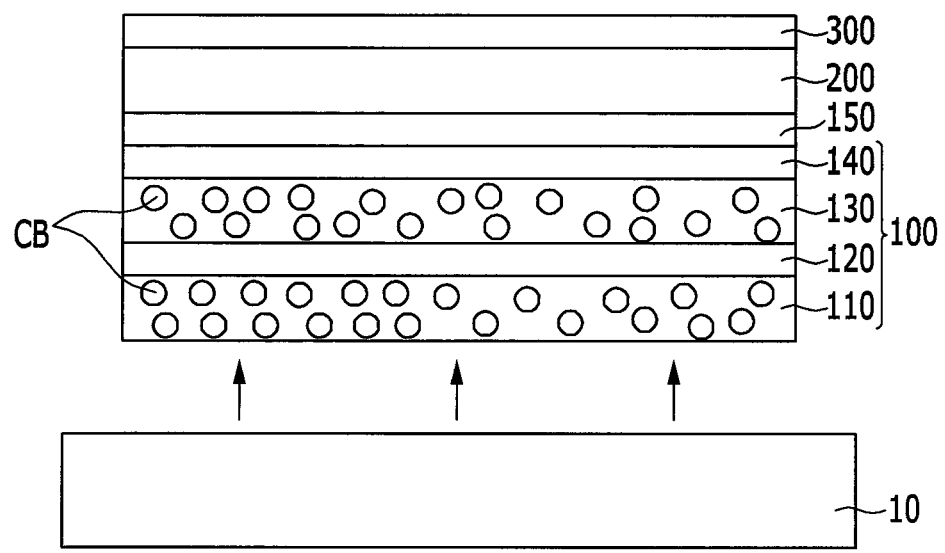

FIGS. 3 and 4 are cross-sectional views before and after a support member is removed during the process of manufacturing a display device according to a first embodiment of the present invention.

According to a method of manufacturing a display device to be described hereafter with reference to FIG. 3, a display panel is formed by forming a plastic substrate 100 on a support member 10, forming a buffer layer 150 thereon, forming a display layer 200 thereon, and forming an encapsulation layer 300 thereon.

The support member 10, for example, a flat glass plate, is not a component of the display device but is an auxiliary plate used during the process of manufacturing the display device. Rigidity of the plastic substrate 100 is a relevant variable during the manufacturing process, and when the substrate bends during the manufacturing process, it becomes insufficient to use vacuum equipment, and when a force is applied to flatten the substrate, the force causes cracks in a film due to thin film stress.

Therefore, the plastic substrate 100 is attached to the support member 10, such as the flat glass plate, during the process, and then the plastic substrate 100 is usually removed when the process of manufacturing a display panel is finished. For example, as illustrated in FIG. 4, the support member 10 is separated from the display panel during a lift-off process. During separation, static electricity due to separation electrification between the plastic substrate 100 and the support member 10 may be generated. In addition, static electricity may be generated due to separation electrification and frictional electrification caused by movement of the display panel between stages during manufacturing of the display panel.

The plastic substrate 100 includes a first plastic layer 110, a first barrier layer 120, a second plastic layer 130, and a second barrier layer 140 from a bottom thereof. According to various example embodiments, the plastic substrate 100 may include one or more additional plastic layers and/or one or more additional barrier layers, and the uppermost layer (e.g., a top layer thereof) may be a plastic layer. The multi-layered plastic substrate 100 may prevent infiltration of water and oxygen therethrough, which is a known defect of comparative plastic substrates, as described above. For example, the plastic substrate 100 may include one plastic layer and one barrier layer.

At least one of the first and second plastic layers 110 and 130 of the plastic substrate 100 includes conductive balls CB. For example, the first plastic layer 110 and/or the second plastic layer 130 may be formed by combining (e.g., mixing) conductive balls CB and a plastic such as a polyimide, coating the mixture on a surface, and then hardening the mixture. The conductive balls CB should be uniformly distributed in the plastic layers 110 and 130.

The conductive balls CB are conductive particulates which may have a micrometer size and/or a nanometer size. For example, the size (i.e., a diameter) of the conductive balls CB may be about 20 μm or less. However, the diameter of the conductive balls CB should be less than the thickness of the plastic layer to be formed. Further, the conductive balls CB may be included in the plastic layer in an amount of about 1 to about 30 parts by weight with respect to about 100 parts by weight plastic depending on the electrical properties. A relatively high content (e.g., concentration) of the conductive balls CB may influence the optical properties of a substrate, such as by reducing transmittance therethrough.

The conductive balls CB may be made of metal, metal oxide, or an alloy thereof, or of carbon fiber. The conductive balls CB may have a core-shell structure having a core made of a material, such as polymer, glass, ceramic, etc. coated with at least one metal. For example, the conductive balls CB may be formed by coating monodisperse polymer particles with metallic materials, such as nickel (Ni) or gold (Au).

Because the conductive balls CB are included in the plastic layers, the first and/or second plastic layers 110 and 130 may be conductive. Therefore, the plastic substrate 100 includes an antistatic layer (that is, the plastic layer itself becomes the antistatic layer), and accordingly, it is possible to remove static electricity due to separation electrification between the plastic substrate 100 and the support member 10 and separation electrification caused by movement of the support member 10 between the manufacturing stages, as described above. Further, the plastic substrate 100 including the antistatic layer may effectively prevent the influence or buildup of static electricity caused by external contact (friction) even after the display panel is manufactured.

A buffer layer 150 preventing diffusion of foreign substances that cause deterioration of the characteristics of a semiconductor, preventing infiltration of water or external air therethrough, and makes the surface flat (e.g., planarizes the surface), may be formed on a top of the substrate 100 (e.g., on the second barrier layer 140). The buffer layer 150 may also be called a blocking layer. The buffer layer 150 may be a monolayer or a multilayer of silicon oxide (e.g., $SiO_x$), silicon nitride (e.g., $SiN_x$), etc. formed by a deposition process, such as PECVD (plasma enhanced chemical vapor deposition), APCVD (atmospheric pressure CVD), or LPCVD (low pressure CVD). The buffer layer 150 may be made of the same material as that of the barrier layers 120 and 140 or may be made of different materials. When made of the same material, the buffer layer 150 may be formed as a multilayer with a different stacking order than that of the barrier layers 120 and 140. The buffer layer 150 may be omitted depending on the kind of the substrate or the process conditions.

The display layer 200 and the encapsulation layer 300 may be formed by suitable processes, for example, a thin film transistor (TFT) forming process (such as a low-temperature polycrystalline silicon (LTPS) process), suitable deposition processes (such as PECVD, APCVD, or LPCVD as described above), and/or a thin film encapsulation (TFE) process.

Figure 5:
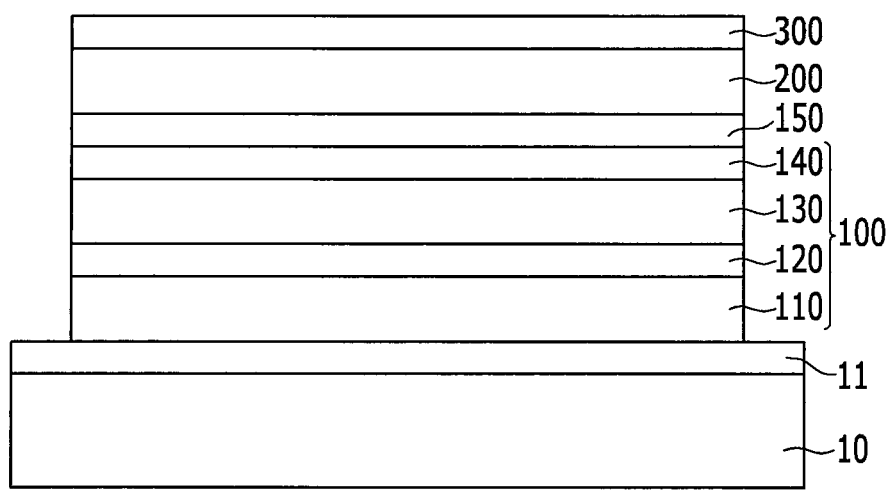
FIGS. 5 and 6 are cross-sectional views of the steps before and after a support member is removed during the process of manufacturing a display device according to a second embodiment of the present invention.
Figure 6:
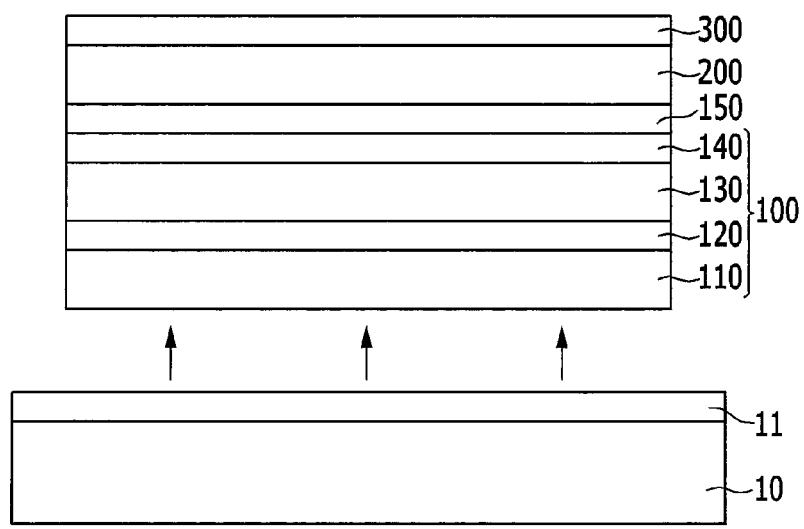

FIGS. 5 and 6 are cross-sectional views of the acts before and after a support member is removed during the process of manufacturing a display device according to a second embodiment of the present invention. Hereafter, the differences from the previous example embodiment (that is, the first embodiment) will be described and repeated components or configurations will be described as brief as possible or may not be described.

A display panel is formed by forming an antistatic layer 11 on a support member 10, forming a plastic substrate 100 thereon, optionally forming a buffer layer 150 thereon, forming a display layer 200 thereon, and then forming an encapsulation layer 300 thereon.

The antistatic layer 11 is formed between the support member 10 and the plastic substrate 100 and may prevent static electricity by reducing separation electrification that occurs when the support member 10 and the display panel are separated, as illustrated in FIG. 6. The antistatic layer 11 may remain on the support member 10 after separating the display panel therefrom.

The antistatic layer 11 may be made of a transparent conductive oxide (TCO) (such as an indium tin oxide (ITO) or an indium zinc oxide (IZO)). In addition, the antistatic layer 11 may be made of a conductive organic material (such as polyacetylene, polypyrrole, polythiophene, polyphenylene vinylene (PPV), or a polyphenylene), or may be formed by depositing a conductive metal.

The plastic substrate 100 includes a first plastic layer 110, a first barrier layer 120, a second plastic layer 130, and a second barrier layer 140 from the bottom thereof. The number of layers in the plastic substrate 100 may be increased or decreased, according to various example embodiments, as described in the first embodiment.

Figure 7:
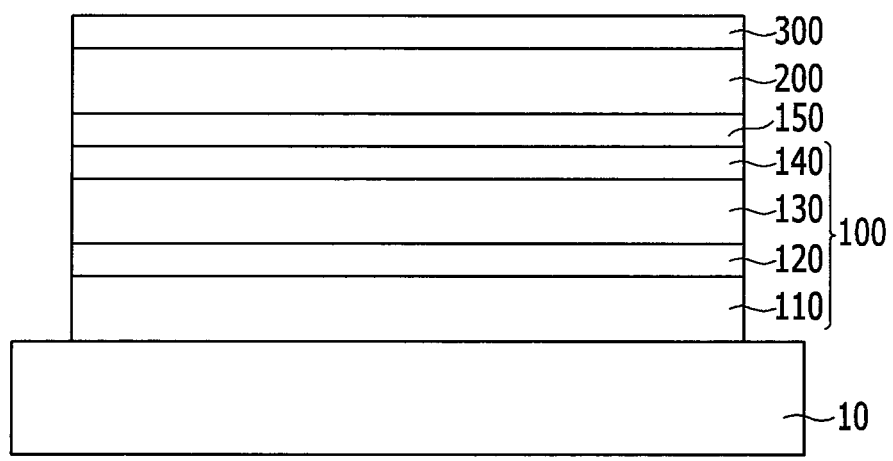
FIG. 7 is a cross-sectional view before a support member is removed during the process of manufacturing a display device according to a third embodiment of the present invention.

FIG. 7 is a cross-sectional view before a support member is removed during the process of manufacturing a display device according to a third embodiment of the present invention.

In this embodiment, unlike the second embodiment described above, an antistatic layer 11 is not formed on a support member 10. Instead, a plate made of a material having antistatic ability, for example, a conductive glass plate is used as the support member 10. In this case, because the support member 10 may itself function as an antistatic layer, static electricity between the support member 10 and the substrate 100 generated during the process of manufacturing a display panel and when they are separated from each other after the display panel is manufactured may be prevented.

The plastic substrate 100 including a first plastic layer 110, a first barrier layer 120, a second plastic layer 130, and a second barrier layer 140 is formed on the support member 10, and a buffer layer 150, a display layer 200, and an encapsulation layer 300 are formed thereon. The stacking structure of the plastic substrate 100 may be modified in various different ways, and the buffer layer 150 may not be included.

Figure 8:
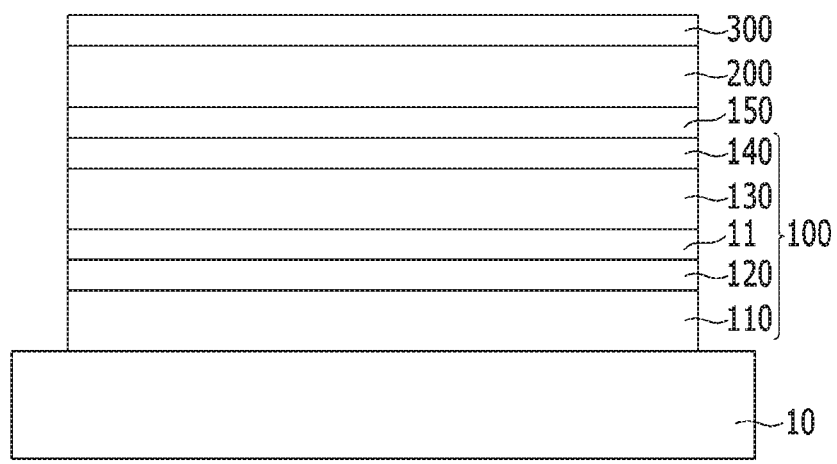
FIG. 8 is a cross-sectional view before a support member is removed during the process of manufacturing a display device according to a fourth embodiment of the present invention.

FIG. 8 is a cross-sectional view before a support member is removed during the process of manufacturing a display device according to a fourth embodiment of the present invention.

In this embodiment, unlike the second embodiment, an antistatic layer 11 is not formed on a support member 10, but is instead formed in a plastic substrate 100. For example, the plastic substrate 100 includes a first plastic layer 110, a first barrier layer 120, an antistatic layer 11, a second plastic layer 130, and a second barrier layer 140.

The antistatic layer 11 may be formed with the barrier layer 120 thereunder and the plastic layer 130 thereover (e.g., thereon) because the adhesive characteristics of a barrier layer to a plastic layer are better than that of a plastic layer to a barrier layer. The antistatic layer 11, however, is not limited to this position and may be formed between the first plastic layer 110 and the first barrier layer 120 or between the second plastic layer 130 and the second barrier layer 140.

When the plastic substrate 100 includes additional plastic layers and barrier layers, the antistatic layer 11 should be formed between the lowermost barrier layer and the plastic layer, if possible, as this configuration would least influence the electrical properties of the display layer 200. The plastic substrate 100 may include a plurality of antistatic layers 11.

Because the antistatic layer 11 is a component of the substrate 100, the antistatic layer 11 may be made of a transparent conductive oxide (TCO) such as indium tin oxide (ITO) or indium zinc oxide (IZO).

Because this embodiment includes the antistatic layer 11 as a component or layer of the plastic substrate 100, as in the first embodiment, it is possible to remove or prevent static electricity not only when manufacturing a display panel but also after manufacturing the display panel.

Aspects of the above-described embodiments may be combined with each other. For example, it is possible to form the antistatic layer 11 on the support member 10 and include the antistatic layer 11 in the plastic layer 100 when manufacturing a display panel.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

Description of Reference Symbols

| | |
|---|---|
| 10: Support member | 11: Antistatic layer |
| 100: Substrate | 110, 130: Plastic layer |
| 120, 140: Barrier layer | 150: Buffer layer |
| 200: Display layer | 300: Encapsulation layer |
| CB: Conductive balls | |

What is claimed is:

1. A display device comprising:
    a substrate comprising a first plastic layer, a first barrier layer, a second plastic layer, a second barrier layer, and an antistatic layer; and
    a display layer on the substrate comprising a plurality of signal lines and a plurality of pixels,
    wherein the first barrier layer is between the first plastic layer and the second plastic layer,
    wherein the second barrier layer is between the second plastic layer and the display layer, and
    wherein the antistatic layer is between the first barrier layer and the second plastic layer.

2. The display device of claim 1, wherein:
    the antistatic layer comprises a transparent conductive oxide.

3. The display device of claim 1, further comprising:
    a buffer layer between the substrate and the display layer.

4. A display device comprising:
    a substrate comprising a first plastic layer, a first barrier layer, a second plastic layer, a second barrier layer, and an antistatic layer; and
    a display layer on the substrate comprising a plurality of signal lines and a plurality of pixels,
    wherein the first barrier layer is between the first plastic layer and the second plastic layer,
    wherein the second barrier layer is between the second plastic layer and the display layer, and
    wherein the first plastic layer comprises the antistatic layer comprising conductive balls, and the conductive balls are conductive particulates.

5. The display device of claim 4, wherein:
    each of conductive balls comprises a metal, metal oxide, metal alloy, and/or carbon fiber.

6. The display device of claim 4, wherein:
    each of the conductive balls comprises a core and a shell, the core comprises a polymer, glass, or ceramic, and the shell is coated with a metal.

\* \* \* \* \*